United States Patent [19]

Muryoi

[11] 4,411,498

[45] Oct. 25, 1983

[54] ZOOM LENS BARREL

[75] Inventor: Takeshi Muryoi, Chigasaki, Japan

[73] Assignee: Nippon Kogaku K.K., Tokyo, Japan

[21] Appl. No.: 246,361

[22] Filed: Mar. 23, 1981

[30] Foreign Application Priority Data

Mar. 31, 1980 [JP] Japan .................. 55-41475[U]

[51] Int. Cl.³ .................. G02B 7/00; G02B 7/11
[52] U.S. Cl. .................. 350/429; 350/252; 350/255
[58] Field of Search .................. 350/429, 252, 255

[56] References Cited

U.S. PATENT DOCUMENTS 3,765,748  10/1973  Mito .................. 350/429
4,124,275  11/1978  Uesugi .................. 350/429
4,315,670  2/1982   Shigoku .................. 350/429

Primary Examiner—John K. Corbin
Assistant Examiner—Paul M. Dzierzynski
Attorney, Agent, or Firm—Shapiro and Shapiro

[57] ABSTRACT

A zoom lens barrel has on the outside of a fixed ring an operating ring rotatable about the optical axis and rectilinearly movable in the direction of the optical axis. The fixed ring has at least three grooves therein extending in a direction substantially coincident with the direction of the optical axis and formed substantially equidistantly in the circumferential direction of the fixed ring. The operating ring has in the inner periphery thereof a groove extending circumferentially of the operating ring. A cam ring provided inside of the operating ring has at least three grooves therein extending in a direction different from the grooves of the fixed ring and the operating ring and formed substantially equidistantly in the circumferential direction of the cam ring. A first lens frame member holding a magnification changing lens optical system and a second lens frame member holding a correction lens optical system are provided inside of the fixed ring. One of the first and second lens frame members has at least three projected members thereon. The other lens frame member is adapted to be moved in the direction of the optical axis in accordance with the rotation of the cam ring and to assume a movement different from that of the one lens frame member.

5 Claims, 3 Drawing Figures

U.S. Patent
Oct. 25, 1983
4,411,498
FIG. 1
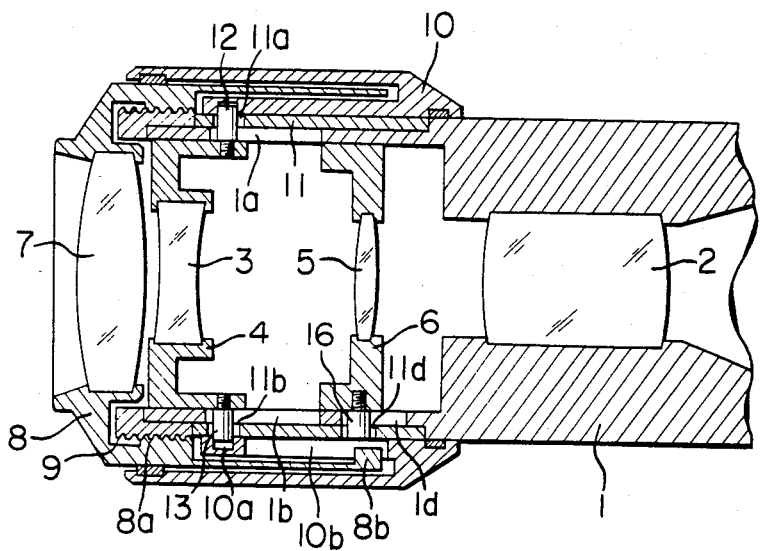
FIG. 2
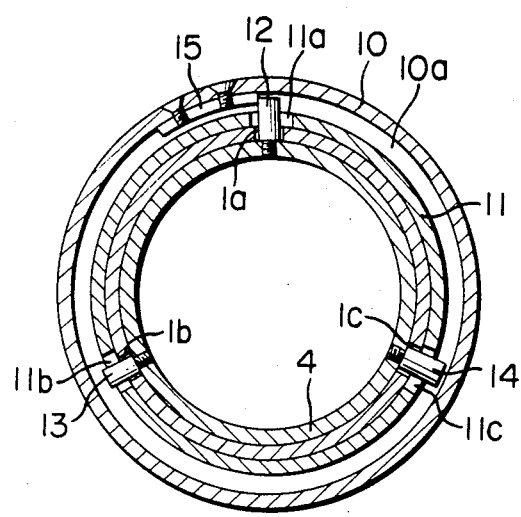
FIG. 3

ZOOM LENS BARREL

BACKGROUND OF THE INVENTION

1. Field of the Invention

This invention relates to a zoom lens barrel wherein zooming is effected by rectilinear movement of an operating ring and focusing is effected by rotation of the operating ring.

2. Description of the Prior Art

In a zoom lens barrel of this type, a single pin is projectedly provided on a magnification changing lens frame member holding a magnification changing lens and this pin is moved in the direction of the optical axis by rectilinear movement of the operating ring, thereby accomplishing zooming. However, if the length of the magnification changing lens frame member which is driven by the single pin is short, the magnification changing lens frame member becomes inclined during the movement thereof and cannot slide smoothly. This has led to the disadvantage that the length of the magnification changing lens frame member has necessarily been large and consequently the length of the entire lens barrel has also been large. On the other hand, in a zoom lens barrel of the type in which zooming operation is accomplished by rotation of the operating ring about the optical axis, three pins are projectedly provided on the magnification changing lens frame member equidistantly along the circumferential direction thereof, these three pins are inserted into three inclined cam grooves formed in a cam ring, and this cam ring is rotated by rotation of the operating ring to thereby move the magnification changing lens frame member in the direction of the optical axis. In the zoom lens barrel of this type, the three pins are held by the cam ring and, therefore, the magnification changing lens frame member need not be made long in the direction of the optical axis. However, if there is any back-lash between the pins and the width of the inclined grooves, a back-lash greater than said back-lash will occur in the direction of the optical axis because of the inclination of the inclined grooves, so that the magnification changing lens cannot be held in a plane perpendicular to the optical axis. Thus, an adverse effect will occur to the lens performance.

SUMMARY OF THE INVENTION

The present invention has for its object to overcome the above-noted disadvantages and to provide a zoom lens barrel in which the slidable lens frame member is a short lens frame member to make the zoom lens barrel compact and in which any inclination of the magnification changing lens resulting from any back-lash in the direction of the optical axis is prevented.

The invention will become fully apparent from the following detailed description of an embodiment thereof taken in conjunction with the accompanying drawings.

BRIEF DESCRIPTION OF THE DRAWINGS

FIG. 1 is a longitudinal cross-sectional view of an embodiment of the present invention.

FIG. 2 is a transverse cross-sectional view corresponding to FIG. 1.

FIG. 3 is an illustration of part of FIG. 2.

DESCRIPTION OF THE PREFERRED EMBODIMENT

Referring to FIG. 1, a master lens 2 is secured to a fixed ring 1 and a diaphragm mechanism not shown, is also installed thereon. Three straight grooves 1a, 1b and 1c extending in the direction of the optical axis are formed in the inner surface of the fixed ring 1 and are arranged substantially equidistantly in the circumferential direction of the fixed ring 1. A magnification changing lens frame member 4 holding a magnification changing lens 3 and a correction lens frame member 6 holding a correction lens 5 are fitted in the fixed ring 1. A focusing lens 7 is held by a focusing ring 8. The focusing ring 8 has an internal threaded portion 8a threadably engaged with the fixed external threaded portion 9 of a cam ring 11. An operating ring 10 is rotatable about the optical axis and slidable along the optical axis. The operating ring 10 is provided with a circumferential groove 10a formed along the circumference thereof and a straight groove 10b formed along the optical axis. The cam ring 11 is rotatably fitted over the outer periphery of the fixed ring 1 and is formed with three similarly configured inclined cam grooves 11a, 11b and 11c as shown in FIG. 2. These inclined cam grooves 11a, 11b and 11c are inclined as is apparent from FIG. 3 and extend in a different direction from either the aforementioned groove 10a or the aforementioned grooves 1a, 1b, 1c. The inclined cam grooves are formed substantially equidistantly in the circumferential direction of the cam ring 11. Three pins 12, 13 and 14 are studded equidistantly, i.e., at every 120°, on the outer periphery of the magnification changing lens frame member 4 as is clearly shown in FIG. 2. These pins 12, 13 and 14 respectively extend through the straight grooves 1a, 1b and 1c of the fixed ring 1 and through the inclined grooves 11a, 11b and 11c of the cam ring 11 and are fitted in the circumferential groove 10a of the operating ring 10. As shown in FIG. 2, one of the three pins, 13, is shorter than the other pins 12 and 14 so that it does not bear against an operating ring rotation limiting plate 15 projectedly provided on the circumferential groove 10a of the operating ring 10. A pin 16 studded on the correction lens frame member 6 extends through the straight groove 1d of the fixed ring 1 and is inserted in an inclined groove 11d formed in the cam ring 11. The protruded portion 8b of the focusing lens frame member 8 is fitted in the straight groove 10b of the operating ring 10 so that upon rotation of the operating ring 10, the focusing lens frame member 8 is rotated therewith.

Operation will now be described. When the operating ring 10 is rectilinearly moved to the right along the optical axis as viewed in FIG. 1, the magnification changing lens frame member 4 is driven at three points due to the engagement between the circumferential groove 10a and the pins 12, 13, 14 and is moved in the direction of the optical axis. The pins 12, 13 and 14 slide in the straight grooves 1a, 1b and 1c, respectively, so the lens frame member 4 does not rotate. Along with the sliding movement of the pins 12, 13 and 14, the cam ring 11 is rotated due to the engagement between the pins 12, 13, 14 and the inclined grooves 11a, 11b, 11c. Along with this rotation, the correction lens frame member 6 slides in the direction of the optical axis due to the engagement between the inclined groove 11d and the pin 16.

In the present embodiment, rightward movement of the operating ring 10 as viewed in FIG. 1 causes rightward movement of both the magnification changing lens 3 and the correction lens 5. However, due to the presence of the inclined grooves 11a, 11b, 11c and 11d, the relative distance between the magnification changing lens 3 and the correction lens 5 is varied with the movement of the operating ring 10 and correction is made so as to always ensure the position focalizing the focus to lie on a film (not shown). Zooming operation is accomplished by such sliding movement of the magnification changing lens 3 and the correction lens 5. In this manner, the magnification changing lens frame member 4 is driven by the three pins and therefore, the frame member 4 can be smoothly slidden within the fixed ring 1 without increasing the length of the frame member 4 in the direction of the optical axis. Also, the pins 12, 13 and 14 are inserted in the inclined grooves 11a, 11b and 11c of the cam ring 11 as well as in the circumferential groove 10a of the operating ring 10 and therefore, even if, as shown in FIG. 3, there is a back-lash between the pin 12, 13, 14 and the width of the inclined groove 11a, 11b, 11c and the inclination of the inclined grooves causes a greater back-lash therebetween in the direction of the optical axis, the magnification changing lens 3 can always be held in a plane substantially perpendicular to the optical axis due to the engagement between the pin and the circumferential groove 10a.

Next, when the operating ring 10 is rotated, the frame member 8 is rotated due to the engagement between the straight groove 10b and the protruded portion 8b and the frame member 8 is moved forwardly or backwardly due to the threaded engagement thereof with the fixed external threaded portion 9, thereby enabling focusing to be accomplished. Since the pin 13 is made short, the rotation limiting plate 15 clears this pin 13 and rotates. When the operating ring 10 is at the shortest near distance, the plate 15, for example, bears against the pin 12 and, when the operating ring 10 is at indefinite distance, the plate 15 bears against the pin 14. In this manner, the pins 12 and 14 are used also to limit the rotation of the operating ring during the focusing.

In the present embodiment, the magnification changing lens frame member 4 is directly driven by the operating ring 10 and the correction lens frame member 6 is driven through the cam ring 11, whereas alternatively the correction lens frame member 6 may be directly driven by the operating ring 10 and the magnification changing lens frame member 4 may be driven through the cam ring 11. In this latter case, three pins 12, 13 and 14 will be formed on the correction lens frame member 6 equidistantly in the circumferential direction thereof. Each of these pins will extend through one of the grooves 1a, 1b, 1c formed in the fixed ring 1 and through one of the grooves 11a, 11b, 11c formed in the cam ring 11 and will be fitted in the circumferential groove 10a of the operating ring 10.

Also, in the illustrated embodiment, grooves 1a, 1b, 1c extending in the direction of the optical axis are provided in the fixed ring 1, whereas these grooves 1a, 1b, 1c need not always be exactly parallel to the optical axis but may be somewhat inclined with respect to the optical axis. Of course, these grooves 1a, 1b, 1c need not be straight.

In the embodiment, straight groove 1d extending in the direction of the optical axis is provided in the fixed ring 1 and inclined groove 11d is provided in the cam ring 11, whereas an inclined groove may be provided in the fixed ring 1 and a straight groove may be provided in the cam ring 11.

Description has hitherto been made of an embodiment in which three straight grooves 1a, 1b, 1c are provided in the fixed ring 1 and three inclined cam grooves 11a, 11b, 11c are provided in the cam ring 11. Alternatively, however, three inclined cam grooves 11a, 11b, 11c may be provided in the fixed ring 1 and three straight grooves 1a, 1b, 1c may be provided in the cam ring 11. Again in this alternative case, each of the straight grooves 1a, 1b, 1c may extend in a direction substantially coincident with the direction of the optical axis and each of the inclined cam grooves 11a, 11b, 11c may extend in a direction different from the circumferential groove 10a and the straight grooves 1a, 1b, 1c. Each of the grooves of the fixed ring 1 and the cam ring 11 may be formed substantially equidistantly in the circumferential direction. The three pins 12, 13, 14 provided on the frame member 4 may respectively extend through one of the grooves formed in the fixed ring 1 and through one of the grooves formed in the cam ring 11, and will be fitted in the circumferential groove 10a of the operating ring 10. In other points, this alternative embodiment may be similar to the embodiment of FIGS. 1-3. In such case, when the operating ring 10 is slidden in the direction of the optical axis, the frame member 4 will move forward or backward while rotating, and the frame member 6 will move forward or backward in accordance with the rotation of the cam ring 11. Of course, if the pins 12, 14 are set to such a length as to bear against the limiting plate 15, these pins 12, 14 may be used also to limit the rotation of the operating ring 10 as in the aforedescribed embodiment. The pins 12, 13, 14 may be provided on the lens frame member 6 instead of on the lens frame member 4.

Pins (12, 13, 14) may be three pins or more;

grooves (1a, 1b, 1c) may be three grooves or more; and grooves (11a, 11b, 11c) may be three grooves or more.

Each of the pins and grooves may be arranged substantially equidistantly in the circumferential direction.

In the present invention, it will be understood that even where various modifications are made as described, the relative distance between the magnification changing lens and the correction lens is displaced in accordance with the movement of the magnification changing lens, whereby correction is made so as to ensure the imaged position during the zooming operation to lie on the film.

According to the present invention, as has been described above, rectilinear movement of the magnification changing lens frame member or the correction lens frame member is accomplished by at least three pins and this permits the length of the frame member to be short. Moreover, the magnification changing lens frame member has the back-lash and inclination thereof in the direction of the optical axis restricted by the circumferential groove of the operating ring and thus, such back-lash and inclination can be very much reduced.

I claim:

1. In a zoom lens barrel having on the outside of a fixed ring an operating ring rotatable about the optical axis and rectilinearly movable in the direction of the optical axis, and wherein a focusing lens optical system is driven by the rotation of said operating ring for focusing and a zooming lens optical system is driven by the rectilinear movement of the operating ring for zooming, the improvement comprising, said operating ring having in an inner periphery thereof an operating ring groove extending circumferentially of said operating ring, said fixed ring having at least first, second and third fixed ring grooves formed therein substantially equidistantly about the periphery of said fixed ring and extending at a first predetermined angle with respect to the operating ring groove, a cam ring provided inside said operating ring and having at least first, second and third cam ring grooves formed therein substantially equidistantly about the periphery of said cam ring, the first, second and third cam ring grooves each extending at a second predetermined angle with respect to the first, second and third fixed ring grooves, respectively, and at a third predetermined angle with respect to said operating ring groove, and a lens frame member for holding part of said zooming lens optical system provided inside of said fixed ring and having at least first, second and third projecting members thereon formed substantially equidistantly in the circumferential direction of said lens frame member, the first, second and third projecting members respectively extending through the first, second and third fixed ring grooves and through the first, second and third cam ring grooves and being fitted in said operating ring groove.

2. A zoom lens barrel according to claim 1, wherein said zooming lens optical system includes a magnification changing lens optical system and a correction lens optical system, and wherein said lens frame member holds said magnification changing lens optical system.

3. A zoom lens barrel according to claim 1, wherein said operating ring has a protruded portion on the inner peripheral surface thereof engagable with one of said projecting members to limit rotation of said operating ring.

4. A zoom lens barrel according to claim 3, wherein each of said first and second projecting members having a length sufficient to engage said protruded portion.

5. A zoom lens barrel according to claim 4, wherein said third projecting member has a length that is insufficient to engage said protruded portion.

* * * * *